United States Patent [19]
Brady

[11] Patent Number: 6,167,544
[45] Date of Patent: Dec. 26, 2000

[54] METHOD AND APPARATUS FOR TESTING DYNAMIC RANDOM ACCESS MEMORY

[75] Inventor: James Brady, Plano, Tex.

[73] Assignee: STMicroelectronics, Inc., Carrollton, Tex.

[21] Appl. No.: 09/136,175

[22] Filed: Aug. 19, 1998

[51] Int. Cl.$^7$ .................................................. G11C 29/00
[52] U.S. Cl. ......................... 714/721; 365/201; 365/222
[58] Field of Search ..................... 714/719, 721; 365/201, 222, 189.09, 189.11, 230.6

[56] References Cited

U.S. PATENT DOCUMENTS

| | | | |
|---|---|---|---|
| 4,127,901 | 11/1978 | Horne et al. ............................. | 365/205 |
| 4,553,225 | 11/1985 | Ohe ......................................... | 365/201 |
| 4,769,792 | 9/1988 | Nogami et al. .......................... | 365/222 |
| 5,157,629 | 10/1992 | Sato et al. ................................ | 365/201 |
| 5,335,202 | 8/1994 | Manning et al. ........................ | 365/222 |
| 5,559,748 | 9/1996 | Numata et al. .......................... | 365/222 |
| 5,587,958 | 12/1996 | Kaneko et al. ..................... | 365/230.06 |
| 5,625,597 | 4/1997 | Hirose ..................................... | 365/201 |
| 5,903,505 | 5/1999 | Wik et al. ................................ | 365/222 |

FOREIGN PATENT DOCUMENTS

WO 98/14955   4/1998   WIPO .

OTHER PUBLICATIONS

EPO; "European Search Report"; EPO Appl. No. EP 99 30 6571; Feb. 4, 2000; pp. 1–3.

*Primary Examiner*—Albert De Cady
*Assistant Examiner*—Shelly A Chase
*Attorney, Agent, or Firm*—Theodore E. Galanthay; Lisa K. Jorgenson; Andre Szuwalski

[57] ABSTRACT

A method and apparatus for reducing the time for determining a memory refresh frequency for a dynamic random access memory. The method includes disabling the bootstrap circuitry associated with a word line when writing data into a memory cell during a test operation. For instances in which data representing a high logic level is written into the memory cell, the resulting charge that is stored is less than the stored charge under normal operation of the dynamic memory. Consequently, the decay time for the stored charge is shortened, thereby shortening the time for testing the refresh frequency of the memory cell. Testing time for the dynamic memory is thus reduced.

20 Claims, 2 Drawing Sheets

METHOD AND APPARATUS FOR TESTING DYNAMIC RANDOM ACCESS MEMORY

BACKGROUND OF THE INVENTION

1. Technical Field of the Invention

The present invention relates to a method of testing dynamic random access memory (DRAM), and particularly to a method for more rapidly testing the storage capability of memory cells in DRAM devices.

2. Background of the Invention

There are two known types of semiconductor memory, one referred as volatile memory and the other referred as non-volatile memory. In volatile memories the stored data is lost when the power supply is removed from the semiconductor device. A non-volatile memory, on the other hand, retains the data stored for extended periods after the power supply to the device has been removed. In a computer or related systems, non-volatile memory is used for long-term storage of programs and data which seldom or never change, and volatile memory devices are used for the short-term storage of program instructions and data during the execution of a program.

Volatile memory devices may be divided into two categories. Static Random Access Memory (SRAM) consists of flip-flop latches such that each SRAM latch maintains a bit of data so long as power is provided to the SRAM. In dynamic memories, a charge representing a data bit is stored on a capacitor.

Conventional DRAM cells employ a single transistor architecture wherein the memory cell comprises a storage capacitor having a first terminal connected to a reference voltage, such as Vss, and a second terminal connected to a pass and/or transmission gate transistor. The pass gate transistor serves to transport charge to the storage capacitor, and also to read the charged or uncharged state of the storage capacitor. The gate electrode of the pass/transmission gate transistor is tied to a word line decode signal and the drain electrode thereof is connected to a bit line. Data is stored in the memory cell as a charge on the storage capacitor. However, because data is stored in a dynamic memory cell as a charge on a capacitor and because memory cells experience leakage current either from the storage capacitor or the pass gate transistor, the stored charge in a dynamic memory cell, particularly a stored charge representing a high logic level, decays over time. Each bit of data in a DRAM device must therefore be periodically refreshed before it has irretrievably decayed.

The pass gate transistor of a dynamic memory cell typically comprises an N-channel field effect transistor. When attempting to store a high logic level (Vdd) into a dynamic memory cell by providing a Vdd level signal to the selected word line and gate electrode of the memory cell pass gate transistor connected thereto, the maximum charge which can be stored on the storage capacitor is Vdd-Vtn, wherein Vtn is the threshold voltage of the pass gate transistor taking into account back bias thereof. Combined with the fact that the charge stored on memory cell storage capacitors decays over time, this maximum voltage level limit necessitates the dynamic memory cells being refreshed relatively frequently.

Techniques have been previously undertaken to decrease the frequency of dynamic memory cell refresh operations. Such techniques include storing a greater charge on the memory cell capacitor during a write operation. One known technique for storing a greater charge on a dynamic memory cell capacitor includes boosting the voltage of the selected word line to a voltage greater than the high reference voltage level (Vdd) when performing a memory cell write operation, which thereby imposes a higher gate voltage on the pass gate transistor of the selected memory cell. Various bootstrapping circuits have been previously employed to increase word line voltage during a write operation. Through utilization of boostrapping circuits, it is possible to store a full high reference voltage level charge onto a dynamic memory cell capacitor so as to lower the frequency of the dynamic memory refresh operation.

Sense amplifiers are typically connected to the bit lines of dynamic memory to sense the small change in potential appearing on the bit lines following a memory cell read operation and to drive the bit lines to the appropriate full reference voltage level, such as Vdd or Vss. Once the sense amplifier drives the bit line to the full reference voltage level, the memory cell from which data was read is refreshed with the full reference voltage signal appearing on the bit line.

It is customary to test both the functionality and timing of integrated circuits in order to ensure that the final product performs as specified. With respect to dynamic memory, it is common to test the ability of dynamic memory cells to maintain a stored charge in order to screen dynamic memory devices having storage capacitors which sufficiently maintain a stored charge from dynamic memory devices having "weak" cells which fail to sufficiently maintain a stored charge. Because each memory cell of a dynamic memory must be tested to determine the ability of the dynamic memory to maintain stored data and hence function properly, it is important that test programs for integrated circuits employing dynamic memory and related systems thoroughly and efficiently test and/or characterize the dynamic memory.

SUMMARY OF THE INVENTION

The present invention overcomes the shortcomings of prior methods for testing memory devices and satisfies a significant need for an effective method of testing dynamic random access memory (DRAM). The present testing method is applicable for stand-alone dynamic memory chips or dynamic memory embedded within an integrated circuit, such as a microprocessor chip or an application specific integrated circuit (ASIC). Especially with respect to embedded DRAM, the testing method of the present invention may be used in conjunction with Built In Self Test (BIST) for the DRAM to ensure that the tested DRAM functions as specified. Alternatively, the testing method of the present invention may be part of a test program used in conjunction with test equipment for wafer-level and chip-level testing to fully characterize the DRAM.

In general terms, the present method shortens the time to perform timing related tests on dynamic memory. Bootstrapping circuitry located within dynamic memory that is normally employed to boost the selected word line voltage of a dynamic memory device above the high reference voltage level for a write operation is disabled during the write operation, so that the word line is instead driven only to the high reference voltage level. The resulting voltage level appearing in the stored memory cell from writing data corresponding to a high logic level into the memory cell is less than the high reference voltage level. The period of time for the stored charge to thereafter decay to a value that cannot be recovered by the corresponding sense amplifier is thus reduced. Consequently, the time for testing the minimum refresh frequency of the DRAM is shortened, as is the overall test time for the DRAM.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE PREFERRED EMBODIMENTS

Figure 1:
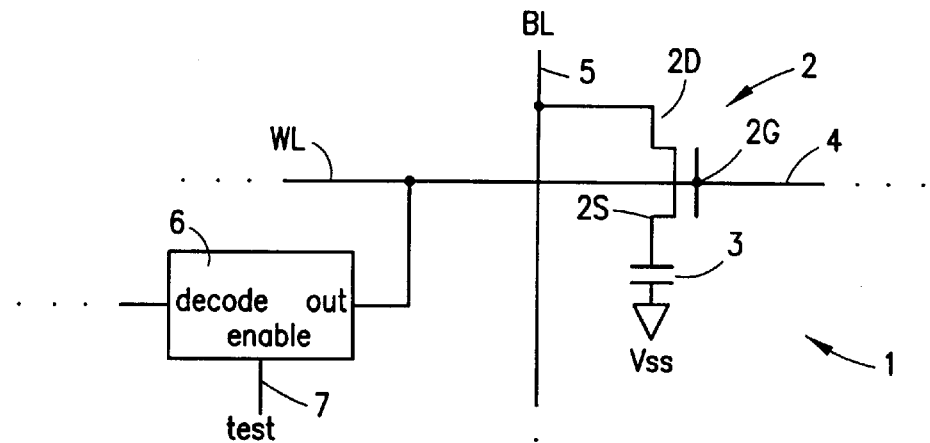
FIG. 1 is a diagram of a dynamic random access memory storage cell and corresponding bootstrapping circuit according to a preferred embodiment of the present invention.

Referring to FIG. 1, there is shown a dynamic random access memory cell 1, including transistor 2 and storage capacitor 3. One plate of storage capacitor 3 is preferably tied to a reference voltage source, such as Vss, and the other plate thereof is connected to the source 2S of transistor 2. Gate electrode 2G of transistor 2 is connected to a word line 4 and drain 2D of transistor 2 is connected to bit line 5. In this way, turning transistor 2 on by placing a relative high voltage on word line 4 allows for charge to be shared between bit line 5 and storage capacitor 3.

Typically, a read operation is performed on memory cell 1 by precharging bit line 5 to an intermediate voltage level, such as Vdd/2, and subsequently driving word line 4 to a high reference voltage source, such as Vdd. The sense amplifier (not shown) associated with bit line 5 senses a voltage differential and drives bit line 5 to an appropriate reference voltage level. A write operation is performed on memory cell 1 by first placing the desired data on bit line 5 and thereafter driving word line 4 to a voltage level greater than the high reference voltage source, using bootstrap circuit 6. Generally, a refresh operation for a memory cell may comprise consecutively performing a read operation immediately followed by a write operation.

Figure 2A:
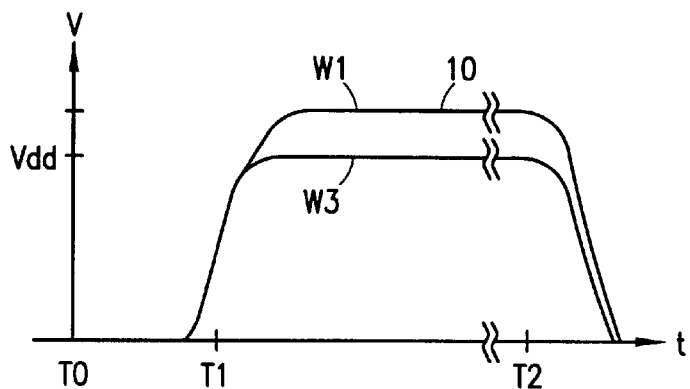
FIGS. 2A and 2B illustrate the voltage waveforms associated with a conventional write operation for dynamic memory and the test method according to a preferred embodiment of the present invention.
Figure 2B:
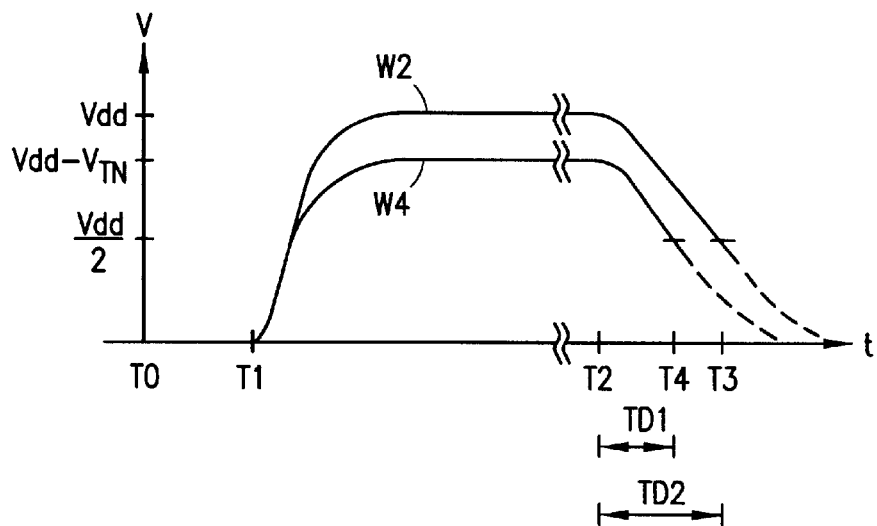

FIGS. 2A and 2B illustrate the write operation for storing data representing a high logic level into a dynamic memory cell during normal operation and during a test operation according to the present invention. Prior to the execution of the write operation, such as between time T0 and time T1, bit line 5 is driven to Vdd. For a write operation during normal operation of the dynamic memory, word line 4 (represented in FIG. 2A as voltage waveform W1) is driven to a value 10 in excess of Vdd at time T1 by bootstrap circuit 6. This rise in voltage on word line 5 turns transistor 2 on, which charges storage capacitor 3, represented in FIG. 2B as voltage waveform W2, to approximately Vdd. At time T2, word line 4 is driven low, which turns transistor 2 off, thereby leaving storage capacitor 3 in an undriven state.

Following time T2, the charge W2 on storage capacitor 3 decays exponentially over time due to leakage current associated with memory cell 1. Eventually the voltage on storage capacitor 3 approaches intermediate value Vdd/2 at time T3. At this point, the sense amplifier associated with bit line 5 can no longer recover the high logic level data stored on storage capacitor 3 because the sense amplifier in this exemplary embodiment is designed to sense a voltage differential between a corresponding bit line pair that is centered at intermediate voltage Vdd/2. Once the voltage on storage capacitor 3 relatively closely approaches Vdd/2, the sense amplifier is not able to distinguish a stored data representing a high logic level from stored data representing a low logic level. The time period between time T2 and time T3 is the thus indicative of the minimum frequency and maximum time period necessary for performing a refresh operation on memory cell 1. In other words, memory cell 1 must be refreshed with data representing a high logic level between time T2 and T3 in order to prevent the stored data representing a high logic level from being irretrievably lost.

It is understood that the dynamic memory may be designed so that the sense amplifier senses a voltage differential appearing on a pair of bit lines that is centered at a voltage level other than Vdd/2. Intermediate voltage Vdd/2 may be often chosen as the voltage level about which a sense amplifier is triggered to optimize access speeds and to account for not only unwanted charge decay when storing data representing a high logic level, but also for unwanted charge build-up when storing data representing a low logic level.

Referring to FIGS. 2A and 2B, the test method according to the present invention will be described with respect to writing data into memory cell 1 representing a high logic level. Prior to the execution of the write operation, such as between time T0 and T1, bit line 5 is driven to Vdd. For a write operation during a preferred test operation of the dynamic memory, word line 4, represented in FIG. 2A as voltage waveform W3, is driven to Vdd at time T1 instead of to a voltage higher than Vdd (as shown by waveform W1 with respect to a normal DRAM operation). The rise in voltage on word line 4 turns transistor 2 on, which charges storage capacitor 3 to Vdd-Vtn, as explained above. The charge stored on storage capacitor 3 is represented in FIG. 2B as voltage waveform W4. At time T2, word line 4 is driven low, which turns transistor 2 off, thereby leaving storage capacitor 3 in an undriven state.

Following time T2, the charge on storage capacitor 3 decays exponentially due to leakage current associated with memory cell 1. Eventually the voltage on storage capacitor 3 approaches intermediate value Vdd/2 at time T4. At this point, the sense amplifier associated with bit line 5 can no longer recover the stored data. Because the charge voltage appearing on storage capacitor 3 during the test operation according to the present invention is less than the voltage appearing on storage capacitor 3 during normal operation, the time TD1 for the stored charge to decay to an unrecoverable level during the test operation is less than the time TD2 for the stored charge to decay to an unrecoverable level during normal DRAM operation. The time period TD1 between time T2 and time T4 is the thus indicative of the minimum frequency and maximum time period for performing a refresh operation on memory cell 1 during the test mode according to the preferred embodiment of the present invention. As a result of charging storage capacitor 3 only to Vdd-Vtn, the time necessary to determine the minimum refresh frequency for memory cell 1 is substantially shortened.

It is noted that because the capacitance value of storage capacitor 3 and the leakage current of memory cell 1 remain substantially the same regardless of whether the dynamic memory is in normal operation or in the test operation according to the present invention, the minimum refresh frequency needed for memory cell 1 during normal operation may be determined once the minimum reference frequency for memory cell 1 during the present test operation is measured. Noting that the time necessary for measuring the minimum refresh frequency during the present test operation is shorter than the time for measuring minimum refresh frequency during normal DRAM operation, a determination of minimum refresh frequency of memory cell 1 during normal DRAM operation is more quickly reached by using the minimum refresh frequency measurement during the present test operation. A substantial savings of test time therefore occurs when the present test operation for determining the minimum refresh operation is employed for testing each memory cell 1 in a DRAM.

Figure 3:
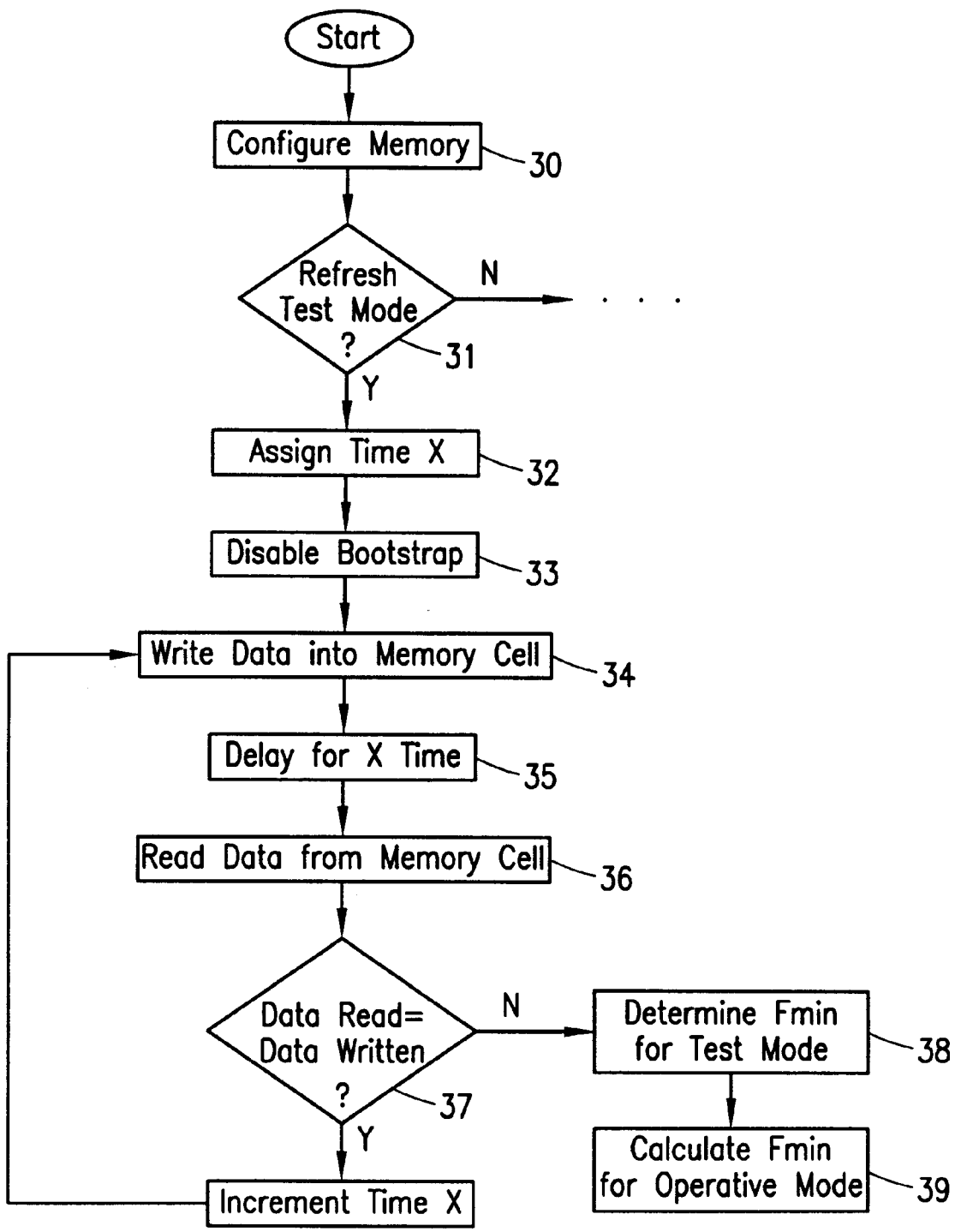
FIG. 3 is a flow chart illustrating the test method according to a preferred embodiment of the present invention.

The operation of the present method of determining the minimum refresh frequency of a memory cell within dynamic memory is illustrated in FIG. 3. At step 31, a determination is made whether memory refresh is to be tested. Upon a determination that dynamic memory refresh is to be tested, a predetermined period of time based upon the expected decay time for memory cell 1 is assigned to variable X in step 35. Bootstrap circuit(s) 6 is disabled at step 33 by test signal 7 (FIG. 1) so that the word line decoders (not shown) of the dynamic memory are capable of driving the word lines, including word line 4, only to Vdd, instead of a voltage greater than Vdd. Test signal 7 may, for example, be generated by chip-level input test signals and/or control circuitry which controls the operation of the dynamic memory. Next, data is written into memory cell 1 at step 34. Data, such as a data representing a high logic level, is stored in memory cell 1 by driving word line 4 to Vdd, as described above. Operation with respect to memory cell 1 is suspended for a predetermined period of time X at step 35. A read operation is performed on memory cell 1 at step 36, after which the data written into memory cell 1 at step 34 is compared with the data read therefrom at step 37. If the written data matches the read data, then steps 34–37 are repeated using a longer delay at step 35. When the written data no longer matches the read data at step 37, a determination of the minimum refresh frequency for memory cell 1 during the present test operation is performed at step 38 to correspond to the largest time period delay X value which produced a favorable comparison in step 37.

Following a determination of the minimum refresh frequency for memory cell 1 during the test operation according to the present invention, the minimum refresh frequency for memory cell 1 during normal operation (with bootstrap circuit 6 being enabled to drive word line 5 to a voltage above Vdd) may be computed at step 39.

By repeating steps 34–37 using different delay periods X in step 35, the above described operation of the present test method may be utilized to characterize and/or to determine the exact refresh timing parameter for memory cell 1. It is understood that steps 34–37 may be performed only once in order to determine whether the refresh timing parameter for memory cell 1 is within an acceptable range. In this case, the period of suspending/delaying operation of memory cell 1 at step 35 is chosen to correspond to the minimum required refresh frequency for the dynamic memory. If the written data matches the retrieved data at step 37, then memory cell 1 is determined to conform its specified refresh parameter.

It is also understood that steps 34–37 may be undertaken for each memory cell in the dynamic memory device being tested.

Bootstrap circuits 6 may be disabled throughout the entire testing of the dynamic memory device instead of solely during the testing of refresh timing parameters. In this case, test signal 7 may be generated by signals or circuitry which configures the dynamic memory into a test mode, such as BIST related circuitry.

The present method may be used in conjunction with automatic refresh generation circuitry for dynamic memory to determine the minimum refresh frequency thereof. In this case, automatic refresh generation circuitry for the dynamic memory (not shown) may be programmable responsive to chip-level test signals 7 to perform refresh operations at varying frequencies. Within any sequence of memory operations, either or both write operations and refresh operations are performed while bootstrap circuit 6 is disabled. When one or more memory read operations fail during a test sequence involving refresh operations at a certain refresh frequency, then the highest refresh frequency corresponding to successful read operations is indicative of the minimum refresh frequency of the dynamic memory while configured in the test mode. The minimum refresh frequency for the dynamic memory operating in a normal or operative mode may be calculated therefrom.

Although the preferred embodiment of the present invention has been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. A method of testing refresh timing of a dynamic memory device connected to a high reference voltage source and a low reference voltage source and including at least one memory cell, at least one bit line selectively connected to the memory cell, at least one word line connected to the memory cell and a bootstrap circuit connected to the word line for providing a voltage thereon in excess of the high reference voltage source during a write operation, said method comprising the steps of:

writing data into the memory cell of the dynamic memory;

waiting a predetermined period of time;

reading the data stored in the memory cell; and comparing the data written into the memory cell with the data read from the memory cell;

said step of writing data into the memory cell includes the step of driving the word line to a voltage level less than the bootstrap circuit driven voltage level in excess of the high reference voltage source.

2. The method of claim 1, wherein:

said step of writing data into the memory cell further includes the step of disabling the bootstrap circuit when writing data into the memory cell.

3. The method of claim 2, further including the step of:

initially configuring the dynamic memory into a test mode; and wherein said step of disabling the bootstrap circuit is performed responsive to an affirmative determination that the dynamic memory is configured in the test mode.

4. The method of claim 1, further including the steps of:

consecutively repeating said steps of writing data, waiting, reading data and comparing a number of times; and updating each said step of waiting with a different predetermined period of time.

5. The method of claim 4, wherein:

said steps of writing data, waiting, reading data and comparing are consecutively repeated until the data read from the memory cell fails to match the data written into the memory cell in said step of comparing.

6. The method of claim 1, further including the step of determining a minimum refresh frequency for the dynamic memory based upon said step of comparing.

7. The method of claim 6, wherein:
the dynamic memory is selectively configurable in an operable mode and a test mode; and
said step of determining a minimum refresh frequency includes the steps of determining a minimum refresh frequency of the dynamic memory when configured in the test mode and determining a minimum refresh frequency of the dynamic memory when configured in the operable mode.

8. The method of claim 7, wherein:
said step of determining a minimum refresh frequency of the dynamic memory when in the operable mode includes the step of calculating a minimum refresh frequency for the dynamic memory when in the operable mode based upon said step of determining a minimum refresh frequency of the dynamic memory when in the test mode.

9. The method of claim 1, wherein:
said step of writing data comprises the step of writing data representing a high logic level into the memory cell of the dynamic memory.

10. A method of testing dynamic memory connected to a high reference voltage source and a low reference voltage source and including a plurality of memory cells, at least one word line and a means for providing a voltage on the word line that is greater than the high reference voltage source, comprising the steps of:
selectively configuring the dynamic memory into a test mode;
writing data into memory cells of the dynamic memory;
reading data from memory cells of the dynamic memory; and
comparing data written into the memory cells of the dynamic memory with data read therefrom;
said step of writing data into memory cells of the dynamic memory includes the step of selectively disabling the voltage providing means during said step of writing data so that a voltage appearing on the word line during said step of writing data does not exceed a voltage level of said high reference voltage source.

11. The method of claim 10, wherein:
said step of disabling the voltage providing means is based upon an affirmative determination that the dynamic memory is configured in a test mode during said step of configuring.

12. The method of claim 10, further including the step of refreshing memory cells of the dynamic memory at predetermined occasions.

13. The method of claim 10, wherein for a memory cell said step of reading data in said memory cell is performed a predetermined period of time following said step of writing data in said memory cell.

14. The method of claim 10, further including the step of determining a minimum refresh frequency for the dynamic memory.

15. The method of claim 14, wherein:
said step of determining a minimum refresh frequency includes the step of determining a minimum refresh frequency of the dynamic memory when in the test mode.

16. The method of claim 15, wherein:
said step of determining a minimum refresh frequency includes the step of calculating a minimum refresh frequency of the dynamic memory when in the operative mode based upon said step of determining a minimum refresh frequency of the dynamic memory when in the test mode.

17. The method of claim 14, wherein:
said step of determining a minimum refresh frequency is based upon a time period between execution of said step of writing data in a memory cell and said step of reading data from said memory cell.

18. The method of claim 17, wherein:
said time period between execution of said step of writing data in a memory cell and said step of reading data from said memory cell is predetermined.

19. A dynamic random access memory device connectible to a high reference voltage source and a low reference voltage source, comprising:
at least one memory cell;
at least one bit line selectively connected to the memory cell;
at least one word line connected to the memory cell; and
a circuit for normally providing a voltage on said word line in excess of the high reference voltage source during a memory write operation, said circuit being selectively disabled based upon a value of a test mode signal so as to provide a voltage on said word line during the memory write operation that is not in excess of the high reference voltage source.

20. The device of claim 19, wherein:
said circuit for providing a voltage is disabled when testing a memory cell refresh parameter.

* * * * *